United States Patent
McMahon et al.

[11] Patent Number: 5,808,875
[45] Date of Patent: Sep. 15, 1998

[54] INTEGRATED CIRCUIT SOLDER-RACK INTERCONNECT MODULE

[75] Inventors: John Francis McMahon, Phoenix; Mostafa Aghazadeh, Tempe; Frank Kolman, Phoenix, all of Ariz.

[73] Assignee: Intel Corporation, Santa Clara, Calif.

[21] Appl. No.: 939,235

[22] Filed: Sep. 29, 1997

Related U.S. Application Data

[63] Continuation of Ser. No. 626,172, Mar. 29, 1996, abandoned.

[51] Int. Cl.$^6$ ........................................................ H05K 7/20
[52] U.S. Cl. .......................... 361/777; 174/263; 228/175; 361/719; 439/66
[58] Field of Search ..................................... 438/618, 694; 29/825, 830, 739, 840; 228/116, 123.1, 180.22, 175, 207, 223, 245; 174/16.3, 52.2, 252, 260–263; 439/66, 71, 74, 86, 90, 91, 526, 591; 361/760, 761, 764, 772, 767–769, 774, 784, 776–778, 790, 791, 704–712, 717–719

[56] References Cited

U.S. PATENT DOCUMENTS

| | | | |
|---|---|---|---|
| 3,872,583 | 3/1975 | Beall | 29/624 |
| 4,646,435 | 3/1987 | Grassauer | 29/840 |
| 5,222,014 | 6/1993 | Lin | 361/414 |
| 5,237,743 | 8/1993 | Busacco | 29/885 |
| 5,473,510 | 12/1995 | Dozier, II | 361/719 |
| 5,477,933 | 12/1995 | Nguyen | 174/262 |
| 5,541,450 | 7/1996 | Jones | 257/697 |
| 5,553,769 | 9/1996 | Ellerson | 228/123.1 |

*Primary Examiner*—Gerald P. Tolin
*Attorney, Agent, or Firm*—Blakely, Sokoloff, Taylor & Zafman

[57] ABSTRACT

An integrated circuit package that has no internal routing or vias within the substrate of the package. The package includes a substrate that has a plurality of bond pads and connecting contact pads located on an outer first surface of the substrate. An integrated circuit is mounted to the first surface and coupled to the bond pads. Mounted to the substrate is a solder rack which contains a plurality of contacts that couple the contact pads to an external printed circuit board.

11 Claims, 2 Drawing Sheets

INTEGRATED CIRCUIT SOLDER-RACK INTERCONNECT MODULE

This is a Continuation Application of application Ser. No. 08/626,172, filed Mar. 29, 1996 now abandoned.

BACKGROUND OF THE INVENTION

1. Field of the Invention

The present invention relates to a package for an integrated circuit.

2. Description of Related Art

Integrated circuits are typically housed within a ceramic or plastic package. The package typically has a plurality of external contacts that are soldered to a printed circuit board. The integrated circuit is typically coupled to a number of bond fingers located within the package. The bond fingers are coupled to the external contacts by internal power/ground planes, routing traces and vias.

Manufacturing a multi-layered package requires various process steps to build each individual layer and the interconnecting vias. The vias are typically formed with a plating process that is both time consuming and costly. It would be desirable to provide a low cost integrated circuit package that can be built without any internal routing layers or vias.

SUMMARY OF THE INVENTION

The present invention is an integrated circuit package that has no internal routing or vias within the substrate of the package. The package includes a substrate that has a plurality of bond pads and connecting contact pads located on an outer first surface of the substrate. An integrated circuit is mounted to the first surface and coupled to the bond pads. Mounted to the substrate is a rack which contains a plurality of contacts that couple the contact pads to an external printed circuit board.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
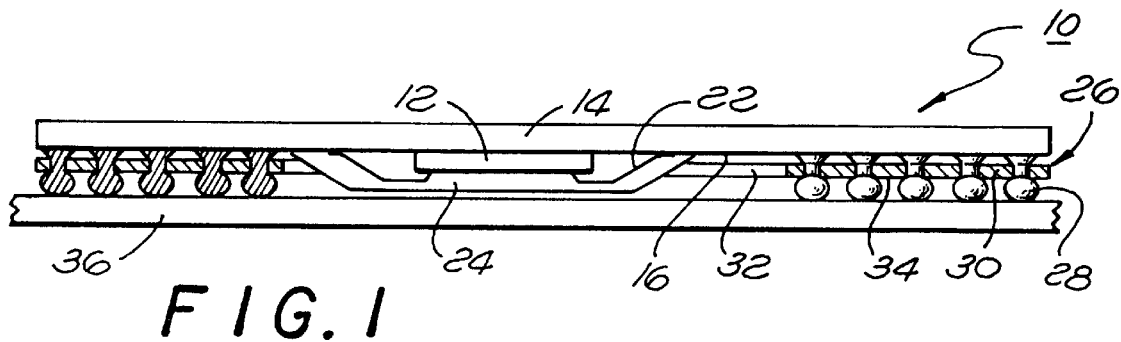
FIG. 1 is a side cross-sectional view of an integrated circuit package of the present invention.
Figure 2:
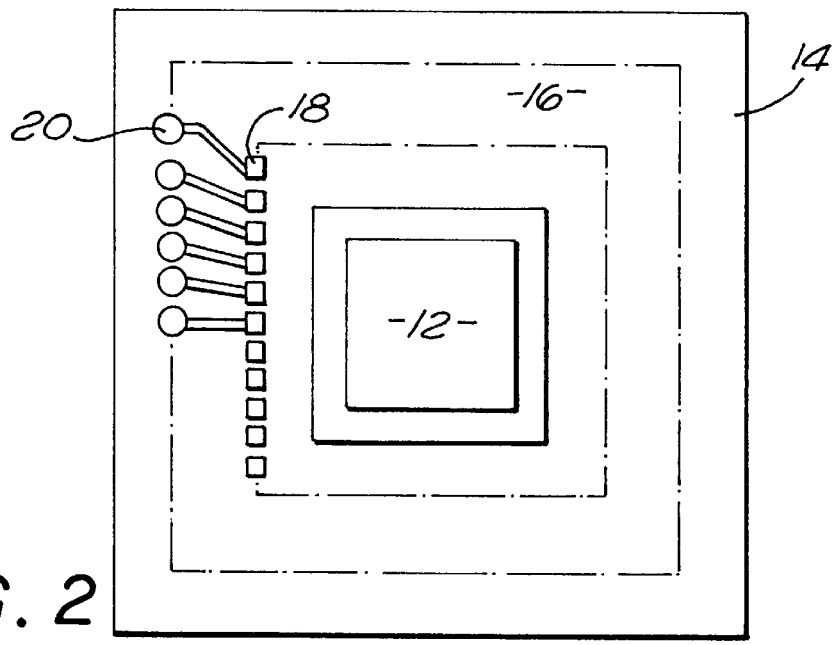
FIG. 2 is a bottom view of a substrate of the package.

Referring to the drawings more particularly by reference numbers, FIGS. 1–2 show an integrated circuit package 10 of the present invention. The package 10 includes an integrated circuit 12 that is mounted to a substrate 14. The integrated circuit 12 is preferably a microprocessor. Although an integrated circuit is shown and described, it is to be understood that the package 10 may contain any electrical device.

The bottom surface 16 of the substrate 14 has a plurality of bond pads 18 that are routed to a plurality of contact pads 20. The integrated circuit 12 is connected to the bond pads 16 by wire bonds 22. As an alternate embodiment, the integrated circuit 12 may be directly mounted to bond pads 18 with solder bumps located on the bottom surface of the die. Such a bonding technique is commonly referred to as "flip chip" or "C4". The substrate 14 may be constructed from a single sided printed circuit board with the bond pads 18, contact pads 20 and fan out routing etched from the top of the board. Alternatively, the substrate 14 can be constructed from known co-fired ceramic packaging materials and processes involving only a single outer etched copper layer. Single metal layer substrates are relatively inexpensive to produce and provide a package product that is significantly lower in cost than multi-layered packages of the prior art. The integrated circuit 12 is typically enclosed by an encapsulant 24.

The package further contains a rack 26 that is mounted to the substrate 14. The rack 26 has a plurality of contacts 28 that are captured by a rack substrate 30 and connected to the contact pads 20 of the substrate 14. The rack 26 preferably has a center opening 32 to provide clearance for the integrated circuit 12 and the encapsulant 24.

The contacts 28 extend from a bottom surface 34 of the rack 26. The contacts 28 can be soldered to an external printed circuit board 36 to mount the package 10 to the board 36. The contacts 28 may each be a dumb-bell shaped solder column that extends through a corresponding hole in the rack 26. The holes can be molded in or formed with conventional drilling techniques. The solder columns can be reflowed to attach the rack 26 to the substrate 14 and the package 10 to the printed circuit board 36.

To assemble the package 10, the integrated circuit 12 is initially mounted to the substrate 14 and coupled to the bond pads 18. The integrated circuit 12 is then typically covered with the encapsulant 24. The rack 26 is placed on the substrate 14 and the solder columns are reflowed to connect the contacts 28 to the contact pads 20. The solder columns may be constructed from a eutectic tin (Sn), lead (Pb) solder. The package can then be assembled to the printed circuit board 36 using conventional reflow techniques.

Figure 3:
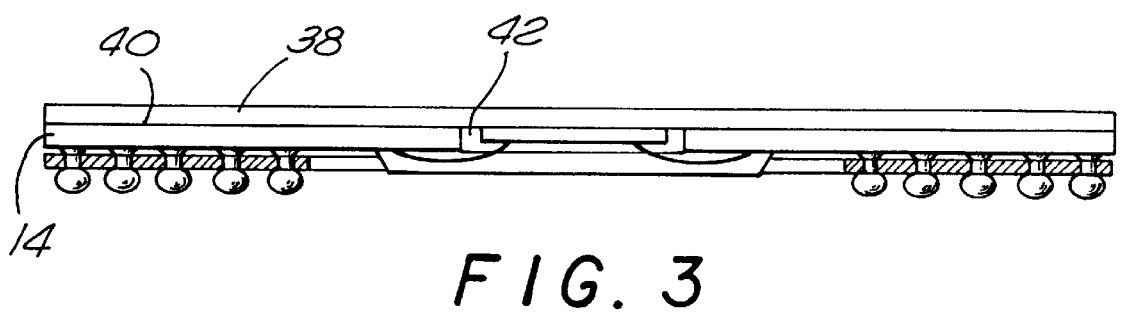
FIG. 3 is a side cross-sectional view of an alternate embodiment of the package.

FIG. 3 shows an alternate embodiment of a package which has a heat slug 38 mounted to a top surface 40 of the substrate 14 to increase the thermal efficiency of the package 10. The substrate 14 preferably contains a cavity 42 that allows the integrated circuit 12 to be mounted directly to the heat slug 38.

Figure 4:
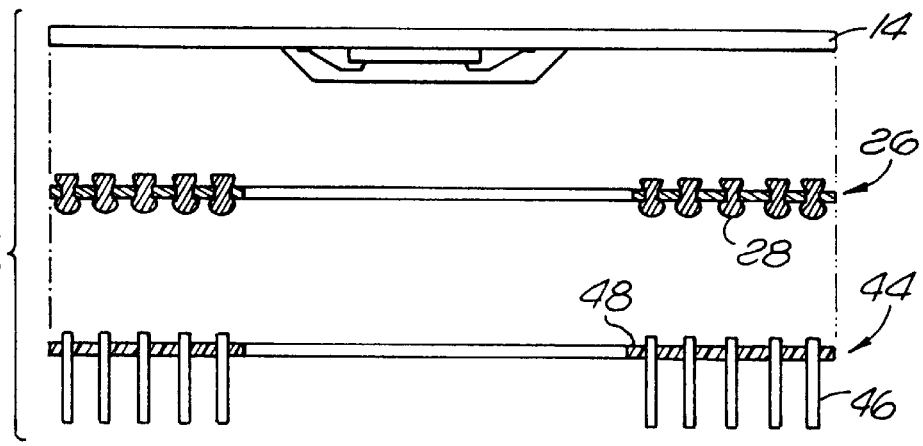
FIG. 4 is a side exploded view of an alternate embodiment of the package.

FIG. 4 shows an alternate embodiment of a package which has a second rack 44. The second rack 44 has a plurality of pins 46 that are captured by a substrate 48 and butt soldered to the contacts 28 of the first rack 26. The pins 46 may be soldered directly to the external printed circuit board 36, or mated to a socket that is mounted to the circuit board.

Figure 5:
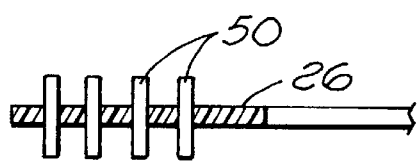
FIG. 5 is a side cross-sectional view of an alternate embodiment of a rack of the package.

FIG. 5 shows an alternate embodiment of a rack 26 which has a plurality of solder column contacts 50.

Figure 6:
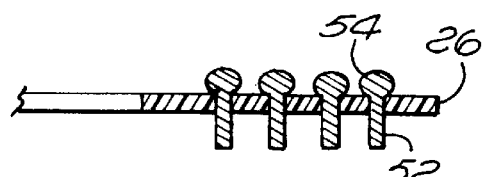
FIG. 6 is a side cross-sectional view of an alternate embodiment of a rack of the package.

FIG. 6 shows an embodiment wherein each contact 52 has a ball 54 at one end, The contacts 52 are preferably constructed from a high temperature lead/tin solder. The package can be mounted to the external printed circuit board 36 with a low temperature solder alloy. The high temperature solder of the contacts will not reflow when the package is subsequently soldered to the circuit board thereby preserving the integrity of the contact pad solder joints.

Figure 7:
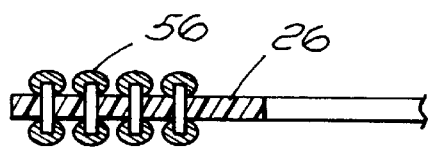
FIG. 7 is a side cross-sectional view of an alternate embodiment of a rack of the package.

FIG. 7 shows an alternate embodiment of a solder rack 26 which has a plurality of solder covered pin contacts 56 that are butt soldered to the substrate 14 and the external printed circuit board 36.

Figure 8:
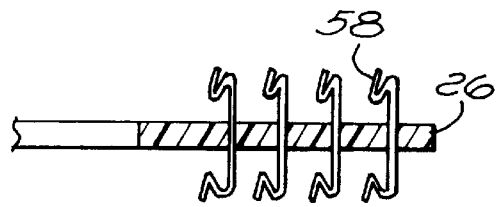
FIG. 8 is a side cross-sectional view of an alternate embodiment of a rack of the package.

FIG. 8 shows an alternate embodiment of a rack 26 which has a plurality of spring contacts 58. The spring rack would require some type of clamping mechanism to press the substrate onto the contacts 58 and the external circuit board 36.

Figure 9:
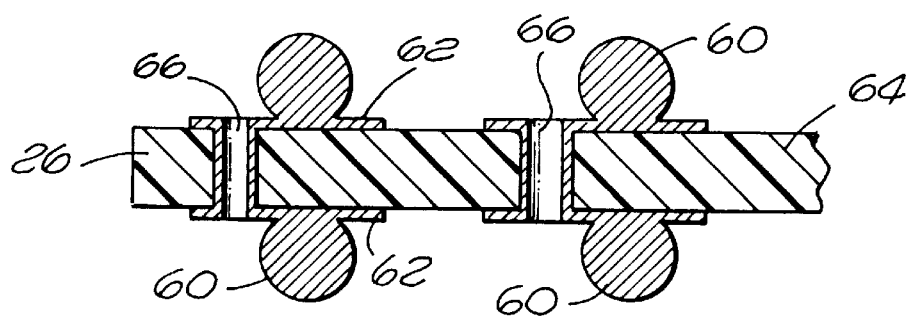
FIG. 9 is a side cross-sectional view of an alternate embodiment of a rack of the package.

FIG. 9 shows an alternate embodiment of a rack 26 wherein each contact consist of a pair of solder balls 60 located on corresponding conductive pads 62 of a rack substrate 64. The conductive pads 62 are coupled together by vias 66 that extend through the substrate 64.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a substrate that has a first surface and an opposite second surface, said first surface having a plurality of bond pads that are routed to a plurality of contact pads on said first surface by a plurality of conductive traces located on said first surface;

an integrated circuit mounted to said first surface of said substrate and coupled to said bond pads;

a first rack that has a first surface, and an opposite second surface that is adjacent to said first surface of said substrate, said first rack having a plurality of contacts that are coupled to said contact pads of said substrate and extend from said first surface of said first rack; and, a printed circuit board that is coupled to said contacts extending from said first surface of said first rack and is separated from said first substrate by said first rack.

2. The package as recited in claim 1, further comprising a heat slug that is attached to said second surface of said substrate.

3. The package as recited in claim 1, further comprising a second rack which has a plurality of pins that are connected to said contacts of said first rack.

4. The package as recited in claim 1, wherein said contacts are each a dumb-bell shaped solder column.

5. The package as recited in claim 1, wherein said contacts are each a pin shaped solder column.

6. The package as recited in claim 1, wherein said contacts are each solder columns that have a ball at one end.

7. The package as recited in claim 1, wherein said contacts are each a solder covered pin.

8. The package as recited in claim 1, wherein said contacts are each a spring.

9. The package as recited in claim 1, wherein said contacts each include a pair of solder balls coupled together by a via that extends through said first solder rack.

10. A method for assembling an package, comprising the steps of:

a) providing a substrate that has a first surface and an opposite second surface, said first surface having a plurality of bond pads that are routed to a plurality of contact pads on said first surface by conductive traces located on said first surface;

b) providing a first rack which has a plurality of contacts that extend from a first surface and an opposite second surface of said first rack;

c) attaching said contacts of said first rack to said contact pads of said substrate; and, d) attaching a printed circuit board to said contacts extending from said first surface of said first rack.

11. The method as recited in claim 10, further comprising the steps of mounting an integrated circuit to said substrate and coupling said integrated circuit to said bond pads.

\* \* \* \* \*